US012756188B2

(12) United States Patent
Joshi et al.

(10) Patent No.: US 12,756,188 B2
(45) Date of Patent: Oct. 6, 2026

(54) SYSTEM AND METHOD FOR ENHANCING POWER FLOW ANALYSIS CONVERGENCE

(71) Applicant: Siemens Aktiengesellschaft, Munich (DE)

(72) Inventors: Abhijeet A. Joshi, Bangalore (IN); Nishanth Marer Prabhu, Bangalore (IN); Bharadwaj Ranganathan Sathyanarayana, Bangalore (IN); Karthik Salian, Bangalore (IN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 290 days.

(21) Appl. No.: 18/731,835

(22) Filed: Jun. 3, 2024

(65) Prior Publication Data

US 2024/0413635 A1 Dec. 12, 2024

(30) Foreign Application Priority Data

Jun. 6, 2023 (EP) .................................... 23177696

(51) Int. Cl.
*H02J 3/00* (2026.01)
*G01R 19/25* (2006.01)
(Continued)

(52) U.S. Cl.
CPC ........ *H02J 3/0012* (2020.01); *G01R 19/2513* (2013.01); *G06F 18/214* (2023.01); (Continued)

(58) Field of Classification Search
CPC .................................................... H02J 3/0012
(Continued)

(56) References Cited

U.S. PATENT DOCUMENTS

2013/0253898 A1* 9/2013 Meagher ................ G06N 20/00 703/18
2014/0136178 A1* 5/2014 Meagher ................ G06F 30/20 703/18
(Continued)

FOREIGN PATENT DOCUMENTS

CA 2684665 A1 2/2009
CN 115313394 A 11/2022

*Primary Examiner* — Travis R Hunnings
(74) *Attorney, Agent, or Firm* — Schmeiser Olsen PLLC

(57) ABSTRACT

A system and method for enhancing power flow analysis convergence are provided. The method includes receiving a first power system artifact from one or more systems associated with a power system. The first power system artifact includes a plurality of data elements associated with the power system at a given time instant. The method further includes extracting a dataset from an archival system. The dataset is extracted based on one or more appropriate data elements selected from the plurality of data elements. The method further includes determining from the extracted dataset a prediction of initial conditions for the power flow analysis using a machine learning algorithm and assigning target variables of the predicted initial conditions to the first power system artifact. Thereafter, the method includes performing the power flow analysis on the first power system artifact using the assigned target variables.

13 Claims, 7 Drawing Sheets

(51) Int. Cl.

| | |
|---|---|
| ***G06F 18/214*** | (2023.01) |
| ***G06N 20/00*** | (2019.01) |
| ***H02J 3/0012*** | (2026.01) |
| *H02J 103/30* | (2026.01) |
| *H02J 103/35* | (2026.01) |

(52) U.S. Cl.
CPC .......... *G06N 20/00* (2019.01); *H02J 2103/30* (2026.01); *H02J 2103/35* (2026.01)

(58) Field of Classification Search
USPC .......................................................... 700/286
See application file for complete search history.

(56) References Cited

U.S. PATENT DOCUMENTS

| | | | | |
|---|---|---|---|---|
| 2015/0112900 | A1* | 4/2015 | Ariyoshi | G06N 20/00 706/46 |
| 2021/0124998 | A1* | 4/2021 | Jaenisch | G06F 12/0207 |
| 2021/0218273 | A1 | 7/2021 | Feng | |
| 2022/0246958 | A1* | 8/2022 | Orihashi | H02J 3/381 |
| 2022/0308573 | A1 | 9/2022 | Ranganathan Sathyanarayana | |

* cited by examiner

SYSTEM AND METHOD FOR ENHANCING POWER FLOW ANALYSIS CONVERGENCE

CROSS-REFERENCE TO RELATED APPLICATIONS

This application claims priority to EP application Ser. No. 23/177,696.4, having a filing date of Jun. 6, 2023, the entire contents of which are hereby incorporated by reference.

FIELD OF TECHNOLOGY

The following relates to an electric power system, and more particularly to power flow analysis.

BACKGROUND

In today's interconnected and increasingly complex power grids, simulations of power system conditions and events are necessary for real-time operations. These simulations provide a virtual platform for analyzing potential risks in the power grid before they occur and allowing operators to take proactive measures for avoiding costly large-scale outages and failures, which can have devastating effects on businesses and utilities.

Further, with the increasing penetration of electric vehicles (EVs) in low voltage grids as well as the growth of distributed energy resources (DERs), transmission systems are becoming increasingly stressed due to high variability in generation fleet coupled with increasingly non-conforming load behavior. To ensure safe and reliable operation of the power grid, it is important to simulate quick and varied yet frequent grid scenarios. Simulation of different scenarios enables assessment of the risks associated with different operational conditions and allows informed decision-making and the implementation of appropriate measures to mitigate the risks.

Additionally, simulation of future grid scenarios is essential for planning ahead for ever-changing energy landscape and for the integration of new technologies into the power grid.

Power flow analysis is an essential tool for providing useful information, by simulating different loads, interchange topological and outage conditions, required for the successful operation of the electric power system. The power flow analysis tool analyzes and determines steady-state operating conditions of the power system and also identifies potential problems in the electric power system, such as overloading or inadequate protection schemes before they become critical issues. In order to determine number of possible future events accurately, computational speed of analyzing the power flow in the electric power system is critical.

Conventionally, there are many methods that can improve the computational and convergence performance of steady state and dynamic simulations in power systems, which include parallelized algorithms designed to solve nonlinear equations faster while still maintaining accuracy. However, these algorithms may not always produce a solution due to numerical errors or a lack of convergence, thus requiring additional steps during initialization process before running the actual calculation itself. Other methods such as prioritization of conditions or events to simulate, approximations in the models employed, and improving the initial condition for the algorithm, can also improve computational and convergence performance. Furthermore, parallel computing and utilizing high performance computer processors can also improve computational and convergence performance. However, these conventional methods are not cost-effective and may not provide highly accurate initial conditions for fast computation of numerical analysis of power system or improved convergence performance of steady state power flow analysis.

In light of the above limitations, there exists a need for a system and method that can enhance power flow analysis convergence with high accuracy and reduced computation time, while also being cost-effective to implement.

SUMMARY

An aspect relates to a method for enhancing power flow analysis convergence. In embodiments, the method comprises receiving a first power system artifact from one or more systems associated with a power system. The first power system artifact includes a plurality of data elements associated with the power system at a given time instant. In an embodiment, the plurality of data elements include primary elements such as node level injection (INJ), local control setpoints (LCS) and topology (TOP), and secondary elements such as primary company load (PCL), and any combination thereof. In embodiments, the method further comprises extracting a dataset from an archival system. The dataset is extracted based on one or more appropriate data elements selected from the plurality of data elements. In embodiments, the method further comprises determining, from the extracted dataset, a prediction of initial conditions for the power flow analysis using a machine learning algorithm and assigning target variables of the predicted initial conditions to the first power system artifact. Finally, in embodiments the method comprises performing the power flow analysis on the first power system artifact using the assigned initial conditions.

As used herein, the one or more systems include at least an industrial control system.

In an embodiment, extracting the dataset comprises selecting the one or more appropriate data elements and filtering a training dataset stored in the archival system based on the one or more appropriate data elements. The training dataset is filtered by performing one of an intuitive filtering, an algorithmic filtering, and a machine learning based filtering.

As used herein, the training dataset includes a plurality of artifacts, their data elements, and target variables and is created using historical real-time scenarios and predetermined scenarios of power system conditions. The training dataset is archived in an archival system on the basis of a static node breaker model.

In an embodiment, prediction of the initial conditions is determined using a proximity search algorithm. As used herein, the proximity search algorithm uses a distance metric to determine the one or more artifacts from the extracted dataset which are nearest to the received first power system artifact in order to predict the initial conditions.

In an embodiment, the target variables include a voltage magnitude and phase angle to perform the power flow analysis on the first power system artifact to achieve a steady state of the power grid.

In an embodiment, the first power system artifact, its data elements, and the target variables on which the first power system artifact is analyzed are stored in the archival system.

In another aspect of embodiments of the present invention, a system for enhancing the power flow analysis convergence is provided. In embodiments, the system comprises one or more processing units. In embodiments, the system further comprises a memory unit coupled to the one or more processing units. The memory unit comprises an analysis unit which is configured for receiving a first power system artifact from one or more systems associated with a power system. The first power system artifact includes a plurality of data elements associated with the power system at a given time instant. The analysis unit is further configured for extracting a dataset from an archival system. The dataset is extracted based on one or more appropriate data elements selected from the plurality of data elements. The analysis unit is further configured for determining from the extracted dataset a prediction of initial conditions for the power flow analysis using a machine learning algorithm. The analysis unit is further configured for assigning target variables of the predicted initial conditions to the first power system artifact and performing the power flow analysis on the first power system artifact using the assigned target variables.

As used herein the analysis unit includes an advanced analysis unit and a network analysis unit. The advanced analysis unit is configured for receiving the first power system artifact from the one or more systems, extracting the dataset from the archival system, determining from the extracted dataset a prediction of initial conditions for the power flow analysis and assigning the target variables of the predicted initial to the first power system artifact, and the network analysis unit is configured for performing the power flow analysis on the first power system artifact using the assigned target variables.

In still another aspect of embodiments of the present invention, a computer-program product having machine-readable instructions stored therein, which when executed, cause the one or more processing units to perform the aforementioned method steps.

Embodiments of the present invention are not limited to a particular computer system platform, processing unit, operating system, or network. One or more aspects of embodiments of the present invention may be distributed among one or more computer systems, for example, servers configured to provide one or more services to one or more client computers, or to perform a complete task in a distributed system. For example, one or more aspects of embodiments of the present invention may be performed on a client-server system that comprises components distributed among one or more server systems that perform multiple functions according to various embodiments. These components comprise, for example, executable, intermediate, or interpreted code, which communicates over a network using a communication protocol. Embodiments of the present invention are not limited to be executable on any particular system or group of systems, and is not limited to any particular distributed architecture, network, or communication protocol and its several details can be modified in various obvious respects, all without departing from the scope of the present disclosure. The above-mentioned and other features of the present disclosure will now be addressed with reference to the accompanying drawings of embodiments of the present invention. The illustrated embodiments are intended to illustrate, but not limit the invention. Accordingly, the drawings and description are to be regarded as illustrative in nature, and not as restrictive.

BRIEF DESCRIPTION

Some of the embodiments will be described in detail, with reference to the following figures, wherein like designations denote like members, wherein.

DETAILED DESCRIPTION

Figure 1:
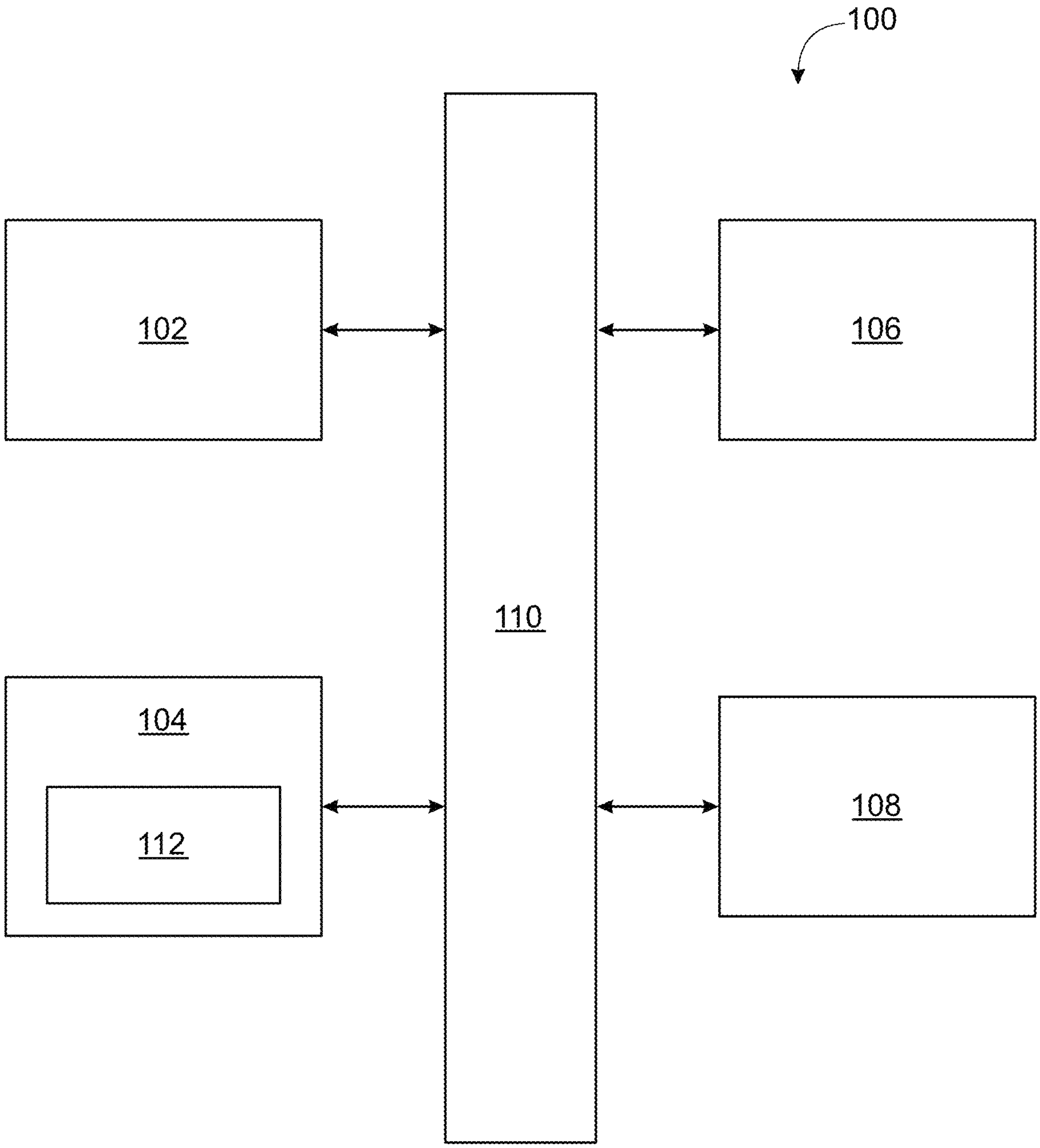
FIG. 1 illustrates a block diagram of a system for enhancing power flow analysis convergence, in accordance with an embodiment of the present disclosure.

Various embodiments are described with reference to the drawings, wherein like reference numerals are used to refer to like elements throughout. In the following description, for the purpose of explanation, numerous specific details are set forth in order to provide thorough understanding of one or more embodiments. It is apparent, however, to one skilled in the conventional art that the embodiments of the present disclosure may be practiced without these specific details or with an equivalent arrangement. In other instances, well-known structures and devices are shown in block diagram form in order to avoid unnecessarily obscuring the embodiments of the present disclosure.

Before beginning a more detailed discussion of the various aspects of the illustrative embodiments, it should first be appreciated that throughout this description the term "mechanism" or "method" will be used to refer to aspects of the present disclosure that perform various operations, functions, and the like. A "mechanism," as the term is used herein, may be an implementation of the functions or aspects of the illustrative embodiments in the form of a system, a method, or a computer program product (non-transitory computer readable storage medium having instructions, which when executed by a processor, perform actions). In the case of a method, the method steps are implemented by one or more devices, apparatus, computers, data processing systems, or the like.

In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general-purpose hardware, software instructions stored on a medium such that the instructions are readily executable by specialized or general purpose hardware, a procedure or method for executing the functions, or a combination of any of the above.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the conventional art in view of the present description that there are many other alternative implementations for these various elements that may be utilized in addition to, or in replacement of, the examples provided herein without departing from the spirit and scope of embodiments of the present invention.

FIG. 1 illustrates a block diagram of a system 100 for enhancing power flow analysis convergence, in accordance with an embodiment of the present disclosure. In embodiments, the system 100 may be a computing system such as a personal computer, a laptop, a Personal Digital Assistant (PDA), a tablet, and the like. In an embodiment, the system 100 comprises one or more processing units 102, a memory unit 104, an input unit 106, an output unit 108, and a system bus 110 for analyzing power flow in a power system.

As used herein, the processing unit 102 is a digital circuit or a type of computational circuit such as but not limited to a microprocessor, microcontroller, graphics processor, digital signal processor, embedded controller, application specific integrated circuits, single chip computers or any other type of processing circuit. The one or more processing units 102 are configured to receive one or more instructions from the memory unit 104 and further configured to execute the received instruction to implement mechanism of embodiments of the present invention.

Figure 2:
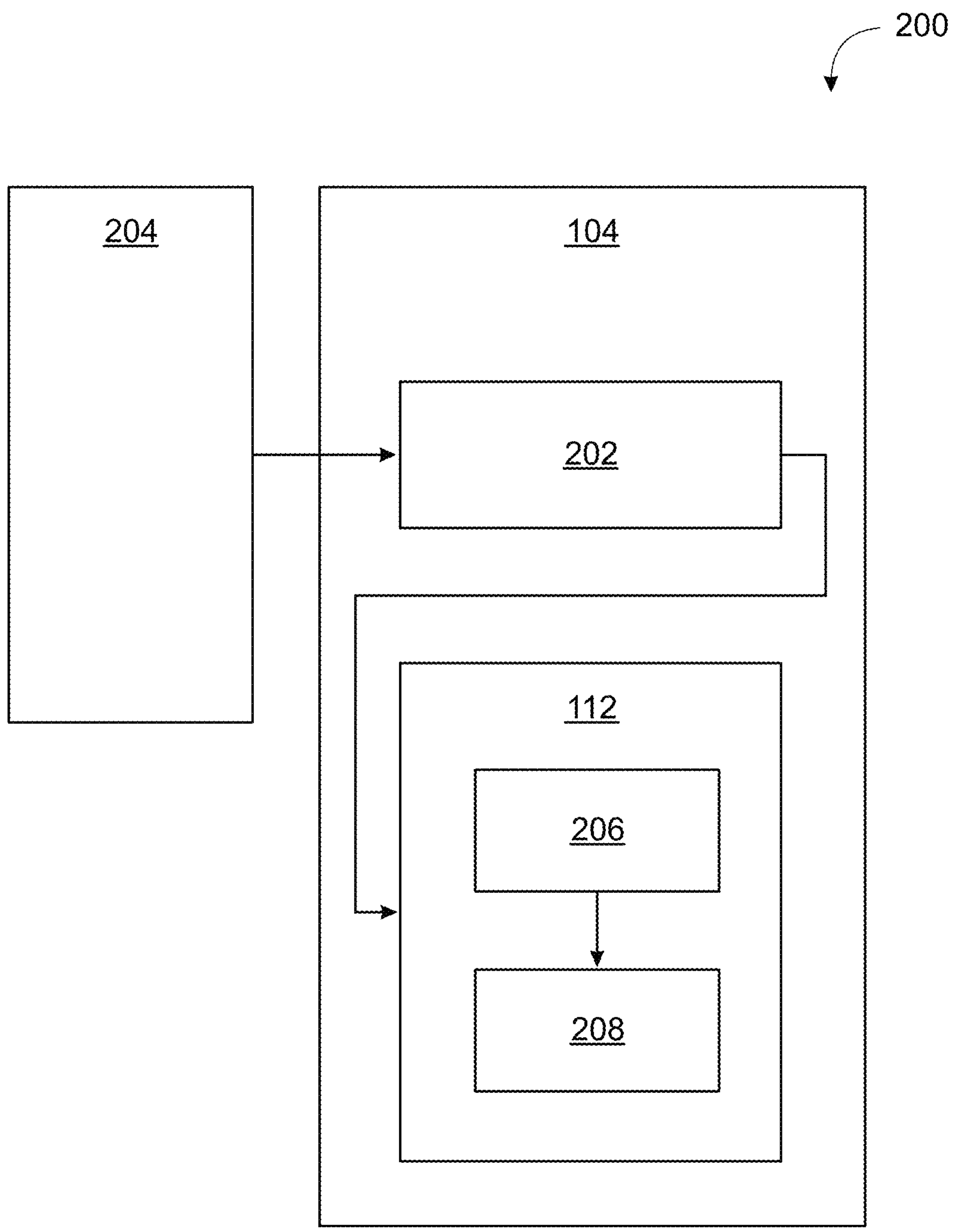
FIG. 2 illustrates a detailed diagram depicting communication between one or more systems and an analysis unit, in accordance with an embodiment of the present disclosure.

The memory unit 104 as used herein is configured for storing data and/or machine-readable instructions executable by the one or more processing units 102. The memory unit 104 may be a volatile memory such as but not limited to Random Access Memory (RAM) and a non-volatile memory such as Read-Only Memory (ROM), flash Memory, etc., or any combination thereof. In the present embodiment, the memory unit 104 comprises an analysis unit 112 stored in the form of machine-readable instructions executable by the one or more processing units 102. The analysis unit 112 when executed by the one or more processing units 102 causes the one or more processing units 102 to receive a first power system artifact from one or more systems and enhance power flow analysis performed on the received first power system artifact, as illustrated in FIG. 2. In another embodiment, functions of the analysis unit 112 may be implemented in a combined form, in which some functions of this unit may be implemented by executing machine-readable instructions and some functions are implemented by hardware.

FIG. 2 illustrates a detailed diagram depicting communication 200 between the one or more systems 202 and the analysis unit 112, in accordance with an embodiment of the present disclosure. The one or more systems 202 collect real time data from the power system 204. The power system 204 is a network that consists of a generation system to convert renewable or non-renewable energy into electrical energy, a transmission system to carry the generated power from the generation systems to the load centers, and a distribution system to provide power to homes and industries within an area. For example, the power system 204 is an electrical grid that includes devices connected to the system such as a synchronous generator, a motor, a transformer, a circuit breaker, a conductor, etc. The one or more systems 202 include at least an industrial control system and one or more grid simulation software packages such as an operation system, an automation system, a control and data acquisition system, an energy management system, a planning system, etc.

The industrial control system (ICS) includes different types of control systems and associated instrumentation, which further include devices, systems, networks, and controls to operate and/or automate power system processes.

The operation system is a computer-aided energy management system (EMS) that is configured to monitor, control, and optimize the performance of the generation or transmission system of the power system. In an exemplary embodiment, Spectrum Power™ active network management is an EMS utilized for the effective management of energy resources by balancing out fluctuating generation capacities and providing a reliable power supply. The automation system collects data from power systems and makes it available through graphical displays, monitoring tools, and energy quality analyzers. The control and data acquisition system analysis unit, such as Supervisory Control and Data Acquisition (SCADA) allows operators to monitor all aspects of the power system from one central location by gathering data from various sources that are connected to each other. The operators can then view this data on their computer screen in real time allowing them to adjust settings accordingly if needed for optimal performance.

The planning system is required for the continuous, safe, and reliable operation of electrical grids as well as energy networks. In an exemplary embodiment, PSS SINCAL is all-in-one simulation software for the planning, design, and operation of power distribution networks. This planning system can be used in balanced, unbalanced, radial, and mesh networks, including single-phase and multi-phase. In other words, these software applications or platforms provide information to operator about the voltage magnitude and phase-angle at all of the power system's buses, allowing them to take action to ensure that all system voltages and power flows remain within specified limits and the power system can withstand potential disturbances.

The one or more systems 202 collect real-time data associated with a power system 204 and provide a first power system artifact to the analysis unit 112. The first power system artifact may be used to estimate state of the power system. The first power system artifact includes a plurality of data elements associated with the power system at a given time instant. In an embodiment, the plurality of data elements include primary elements such as node level injection (INJ), local control setpoints (LCS), and topology (TOP), secondary elements such as primary company load (PCL), branch admittances, and any combination thereof. In an exemplary embodiment, the plurality of data elements that influence the power flow analysis are bus injections and the branch admittances, as shown in the non-linear power flow equations below:

$$P_k - \sum_{i=1}^{n} V_k V_i [g_{ik} \cos(\delta_k - \delta_i) + b_{ik} \sin(\delta_k - \delta_i)] = 0$$

$$Q_k - \sum_{i=1}^{n} V_k V_i [g_{ik} \cos(\delta_k - \delta_i) + b_{ik} \sin(\delta_k - \delta_i)] = 0$$

Wherein k=1, 2 . . . n $P_k$ and $Q_k$ are bus injections, $g_{ik}$ and $b_{ik}$ are branch admittances $V_k$ $V_i$ and $\delta_k$ $\delta_i$ are target variables wherein $V_k$ $V_i$ are voltage magnitude and $\delta_k$ $\delta_i$ are phase angle.

The bus injections are generally influenced by fluctuations in power consumption at load buses and generator output at generator buses, and therefore, powers at load buses and generator buses are grouped as injections (INJ) with opposite sign conventions. The bus injection is either real or reactive power that is being applied to or withdrawn from a bus by an element, which is a generator or a load, with its other terminal connected to ground. The bus injection may be a positive injection or a negative injection, the positive injection is defined when power is flowing from the element into the bus, and a negative injection is defined when power is flowing from the bus into the element. The bus injection also comprises the active and reactive components of complex power.

The branch admittance is related to the conductance, and susceptance of the branch, and is represented by a complex number, with the real part representing the conductance of the branch and the imaginary part representing the susceptance. The branch admittances measure electrical conductance of branches in an electrical network of power system and are influenced by changes in topology (TOP) and local control setpoints (LCS) of regulating devices such as transformer tap changers, voltage-controlled capacitors, and reactors in the electrical network. Topology in general represents arrangement of electrical components in the power system and local control setpoints represents reference set point of the desired voltage to be induced by the locally acting control device in the field by changing its tap setting.

In an embodiment, the analysis unit 112 further includes an advanced analysis unit 206 and a network analysis unit 208. The advanced analysis unit 206 when executed by the one or more processing units 102 causes the one or more processing units 102 to receive a first power system artifact, extract a dataset from an archival system, determine a prediction of initial conditions for the power flow analysis, and assign target variables of the predicted initial conditions to the first power system artifact. In an embodiment, the prediction of initial conditions is determined for full ac power flow analysis. The network analysis unit 208 uses the assigned target variables of the predicted initial conditions for performing the power flow analysis of the first power system artifact. In an embodiment, the analysis unit 208 uses the assigned target variables of the predicted initial conditions for performing the full ac power flow analysis on the first power system artifact. The power flow analysis of the first power system artifact using the predicted initial conditions reduces number of iterations of analysis, improves speed of computation, and hence computation time.

Figure 3:
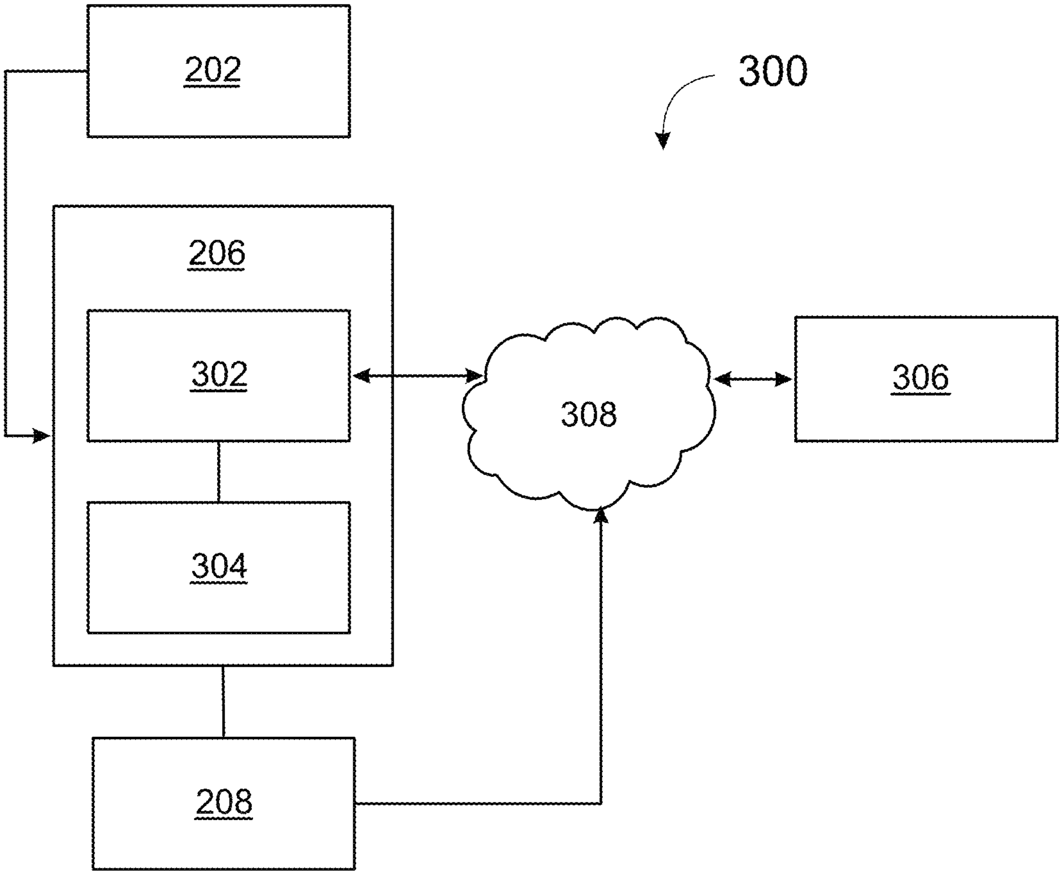
FIG. 3 illustrates a block diagram depicting interaction of the analysis unit with archive system, in accordance with an embodiment of the present disclosure.

FIG. 3 illustrates a block diagram depicting communication 300 of the analysis unit with the archival system, in accordance with an embodiment of the present disclosure. As illustrated, the advanced analysis unit 206 and the network analysis unit 208 communicate with the archival system 306 via a network 308. As an example, the network 308 includes at least one of, but is not limited to, a personal area network (PAN), a local area network (LAN), a metropolitan area network (MAN), cellular technology such as 3G, 4G LTE, 5G, etc., and a wide area network (WAN). In an embodiment, the network 308 can be a combination of one or more of these networks.

The archival system 306 stores a training dataset which includes a plurality of artifacts, their data elements, and target variables and is created using historical real-time scenarios and predetermined scenarios of power system conditions. In an exemplary embodiment, the predetermined scenarios of the power system condition include a range of scenarios where the electric power system is operating under challenging or unprecedented circumstances. These can include extreme weather events, such as floods, hurricanes, or heat waves, as well as situations where energy supplies are limited or unavailable, and more. Since the memory unit 104 of the system may have a limit to the extent of data that can be stored, for example, the maximum capacity to store in the hard disk may be 50 Gigabytes. Therefore, the plurality of artifacts, their data elements, and the target variables are archived from memory of the system 100 to the archival system 306. In an embodiment, a gigabit Ethernet switch (not shown) can be used to connect the network with the archival system 306. In an embodiment, a static node breaker model may be used to archive the training dataset. The main objective of using the model is to provide consistent dimensioning of the artifacts across all data elements as there may be a possibility of topological differences between the data elements. The archival system 306 preserves historical real-time scenarios and predetermined scenarios of power system conditions securely and efficiently in an organized manner, as illustrated in FIG. 4.

Figure 4:
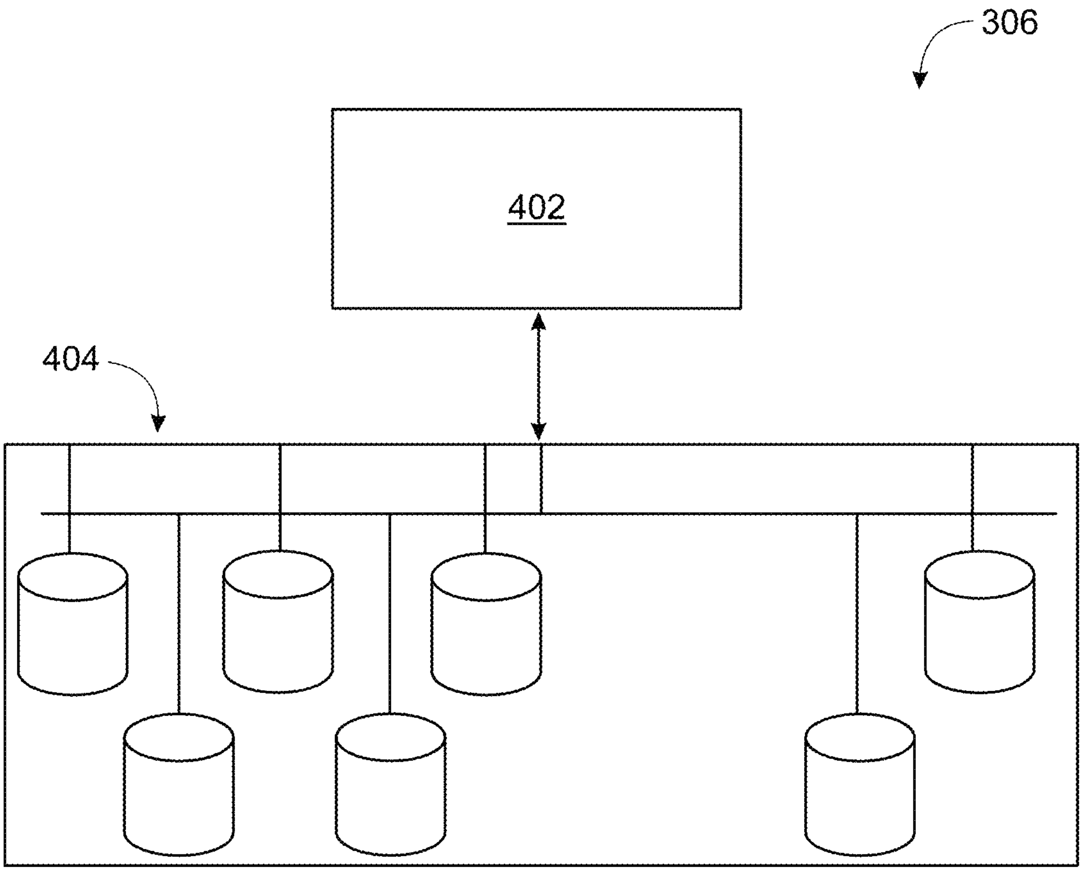
FIG. 4 illustrates a block diagram of the archive system, in accordance with an embodiment of the present disclosure.

Referring to FIG. 4, the archival system 306 includes a rack 402 and a secondary storage system 404 for archiving the plurality of artifacts, their data elements, and target variables. Most importantly, the archival system organizes data in a logical manner, allowing quick access of the data when needed. In an exemplary embodiment, SPARQL queries can be used to access the suitable data from the archival system.

In an embodiment, the rack 402 is used to implement operations such as archiving or retrieving the training dataset stored at the archival system 306. The rack 402 is also configured to power-on the secondary storage media that is in a low power mode of operation. The secondary storage system 404 may include a plurality of secondary storage media. In an exemplary embodiment, the secondary storage system 404 may include shelves such as a first shelf and a second shelf. It should be appreciated that the secondary storage system 404 may have more than or fewer than two shelves. The archival system 306 provides the training dataset that is archived in the archival system by the one or more system (202) during online or offline mode. As an example, Operational Data Model System (ODMS) is an archival system that stores and manages large amounts of data in a vendor agnostic model standard like IEC 61970-Common Information Model (CIM). The ODMS archival system is a software platform which is highly customizable, secure with encryption and other security protocols, and flexible to allow easy scale up or down as needed.

The advanced analysis unit 206, on receiving the first power system artifact which includes the plurality of data elements, performs extraction of the dataset from the training dataset archived in the archival system 306. In an embodiment, the advanced analysis unit 206 utilizes an extraction unit 302 which is configured to select one or more appropriate data elements from the plurality of data elements included in the first power system artifact.

The one or more appropriate data elements are selected by iterating through each of the plurality of data elements during training based on minimization of error of the predicted initial conditions with respect to actual solved power flow voltage solution for the training dataset using techniques like Auto-ML, data visualization techniques, rigorous error analysis, etc. The iterative process typically involves several rounds of testing the data elements to select the one or more appropriate data elements. In another embodiment, the one or more appropriate data elements are selected by the operator based on intuition and understanding of the power system. This process involves performing careful consideration of each data elements' relevance to the power system in question, and determining the one or more appropriate data elements which are most beneficial when applied in the dataset filtration procedure.

The extraction unit 302 is further configured to filter the training dataset based on the one or more appropriate data elements selected from the plurality of data elements. In an embodiment, the dataset is filtered from the training dataset by performing one of filtering methods such as an intuitive filtering, an algorithmic filtering, and a machine learning based filtering. The intuitive filtering involves setting up the filter to extract the dataset using the selected one or more appropriate data elements, and the algorithmic filtering and the machine learning based filtering involve using an algorithm to filter the dataset using the selected one or more appropriate data elements. It should be noted that the filtering is used for reducing search radius in the data element space, providing a narrow dataset that is relevant, and hence reducing the time for determining the prediction of initial conditions for the power flow analysis.

The advanced analysis unit 206 further utilizes a determining unit 304 to determine, from the extracted dataset, the prediction of initial conditions for the power flow analysis using a machine learning algorithm and assign the target variables, which include voltage magnitude and phase angle to the first power system artifact. The determining unit 304 utilizes a proximity search algorithm to determine the prediction of the initial conditions. The initial conditions are predicted from the determined one or more artifacts and provide the target variables or initial operating states to perform the power flow analysis on the first power system.

The proximity search algorithm uses at least one of a distance metrics such as a Euclidean distance metric, a Manhattan distance metric, a Chebyshev distance metric, and a Minkowski distance metric to determine one or more artifacts nearest to the received first power system artifact from the extracted dataset in order to predict the initial condition. In an exemplary embodiment, the one or more artifacts are determined using a one-nearest neighbor classifier algorithm and the target variables of the determined one or more artifacts are assigned to the first power system artifact.

The one-nearest neighbor classifier algorithm is a supervised machine learning technique that uses a Euclidean distance metric for determining the one or more artifacts in the extracted dataset. This algorithm works by predicting the one or more artifacts that act as initial conditions in relation to the first power system artifact and assigning the target variables of the predicted initial conditions to the first power system artifact. In an embodiment, the Euclidean Distance Metric calculates distance between data elements of the first power system artifact and the same data elements of each artifact of the extracted dataset. It should be noted that the data elements herein include all of the plurality of data elements except the one or more appropriate data elements. For example, if the first power system artifact includes the plurality of data elements such as PCL, INJ, and TOP, and PCL is used for extracting the dataset from the training dataset then the data elements for calculating the distance include only INJ and TOP.

It should be noted that a Euclidean distance is a line segment between data elements of the first power system artifact and data elements of each of the artifact in the extracted dataset and the Euclidean Distance Metric determines how far data elements of each artifact are from data elements of the first power system artifact based on the distance of their coordinates in a multidimensional space and allows analyzing artifact with many data elements while still maintaining high level accuracy in determining the initial conditions. The proximity search algorithm provides a quick and accurate method of determining the prediction of initial conditions and utilizing the target variables of the initial conditions to perform the power flow analysis of the first power system artifacts.

The input unit 106 may include input means such as but not limited to keypad, touchpad, camera, and microphone, to enable user to input at least one or more appropriate data elements utilized for extracting the dataset from the archival system, a command, data, etc. in the system 100. The output unit 108 includes a mean such as a graphical user interface, monitor, display etc. for displaying output received from the one or more processing units 102 on executing the analysis unit stored in the memory unit 104.

In embodiments, the system bus 110 may include a bus memory or bus memory controller, a peripheral bus, and a local bus capable of interacting with any other bus architecture. In embodiments, the system bus 110 is further capable of allowing interconnection among the one or more processing units 102, the memory unit 104, the input unit 106, the output unit 108, and the system bus 110. Those of ordinary skill in the conventional art will appreciate that the system 100 illustrated in FIG. 1 is provided for the purpose of explanation only and is not meant to imply architectural limitations with respect to the present disclosure. Further, several modifications to the system shown in FIG. 1 may be implemented without departing from the spirit and scope of embodiments of the present invention. For example, other peripheral devices such as adapter, graphics adapter, an optical disk drive, disk controller, input/output (I/O) adapter may also be used in addition to the components depicted in the figure.

Figure 5:
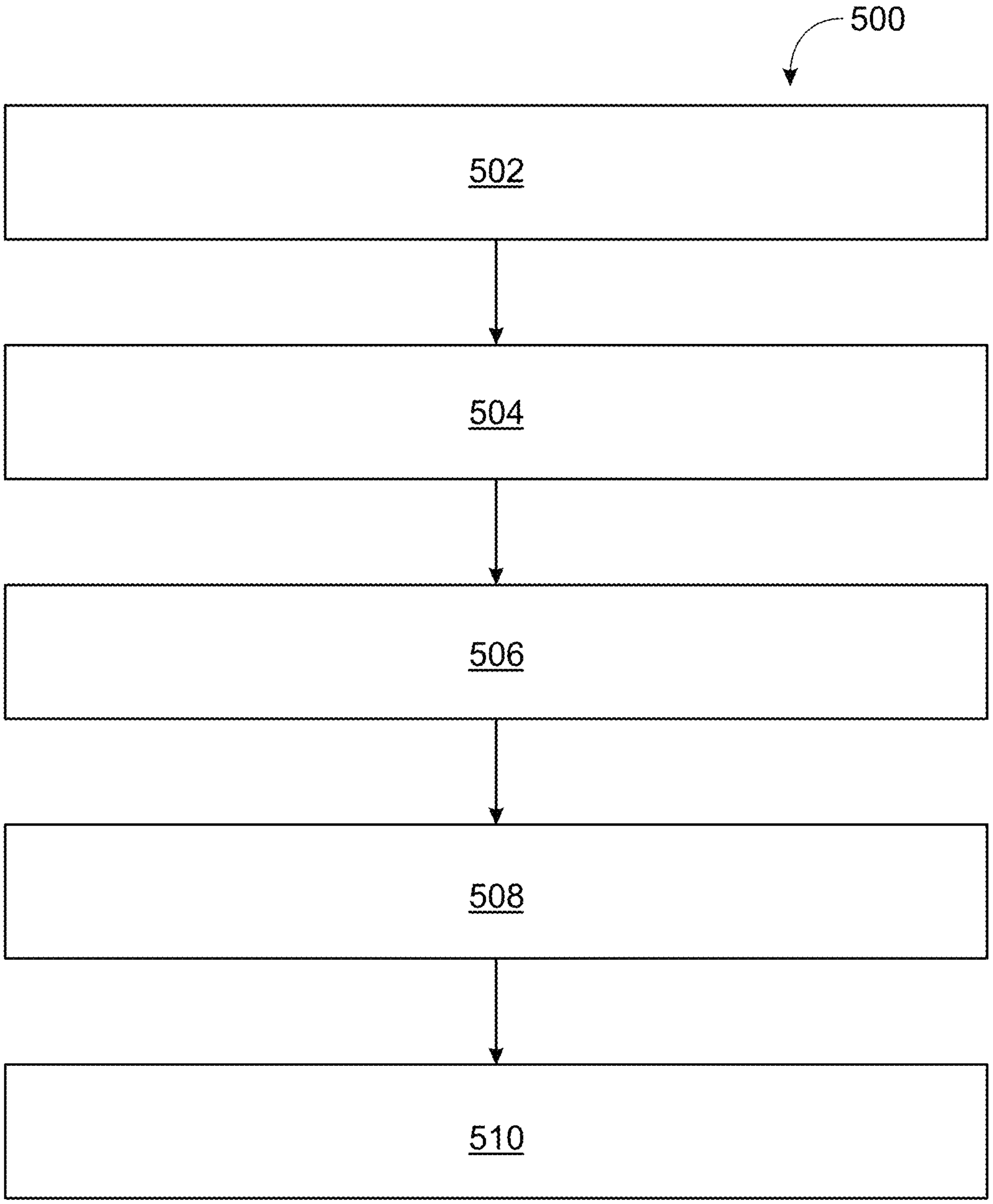
FIG. 5 shows a flowchart of a method for enhancing power flow analysis convergence, in accordance with an embodiment of the present disclosure.

FIG. 5 is a flowchart of a method 500 for enhancing the power flow analysis convergence, in accordance with an embodiment of the present disclosure. As will be discussed in greater detail hereafter, the illustrative embodiments are integrated to enhance the power flow analysis convergence. In order to understand the context of enhancing the power flow solutions, it is important to first have an understanding of how connection is implemented before describing the method of the illustrative embodiments integrated to enhance the power flow analysis convergence. In particular, in embodiments the method described herein is generally applicable to solve the power flow problem which is fundamentally a network analysis problem of any power system. The power flow analysis is performed on real-time power system artifact on receiving a request from the one or more systems 202.

Accordingly, in embodiments the method 500 begins at step 502 on receiving the first power system artifact associated with a power system from the one or more systems 202. The first power system artifact includes a plurality of data elements associated with the power system at a given time instant and include primary elements such as node level injection (INJ), local control setpoints (LCS) and topology (TOP), secondary elements such as primary company load (PCL), and any combination thereof. In an exemplary embodiment, the method 500 may be used for a power system artifact N received from the energy management system. The power system artifact N includes data elements INJ, TOP, and PCL. As used herein the INJ includes INJ.MW which is node level megawatt injection vector representing total injected megawatt into the power system at each connectivity node and INJ.MVAR which is node level megavolt ampere of reactive power (MVAR) injection vector that represents the total injected MVAR into the power system at each connectivity node. TOP is a topology that represents an arrangement of electrical components in the power system, such as transformers, circuit breakers, and transmission lines. The topology of the power system affects how power is transmitted, distributed, and managed. TOP includes 1 for open arrangement and 0 for close arrangement of the electrical components.

Successively, a dataset is extracted from the archival system 306, at step 504. In an embodiment, the dataset is extracted based on one or more appropriate data elements selected from the plurality of data elements. The dataset extraction comprises selecting the one or more appropriate data elements and filtering the training dataset stored in the archival system (306), using one of an intuitive filtering, an algorithmic filtering, and a machine learning based filtering. In an embodiment, the one or more appropriate data is selected by iterating through each of the plurality of data elements during training based on minimization of error of the predicted initial conditions with respect to the actual solved power flow voltage solution for the training dataset using techniques like Auto-ML, data visualization techniques, rigorous error analysis, etc. In an exemplary embodiment, the method 500 utilizes element PCL as the appropriate data element for filtering the dataset from the training dataset. In other words, the dataset includes all artifacts which include element PCL.

Successively, prediction of the initial conditions for the power flow analysis is determined at step 506, using a machine learning algorithm. In an exemplary embodiment, proximity search algorithm is used to determine one or more artifacts nearest to the received first power system artifact using the distance metric in order to predict the initial condition. The distance metric determines the distance between the first power system artifact and each artifact in the dataset.

Successively, target variables of the predicted initial conditions are assigned to the first power system artifact, at step 508. In an embodiment, the target variables include a voltage magnitude and a phase angle to perform the power flow analysis on the first power system artifact to achieve a steady state of the power system.

Finally, the power flow analysis is performed, at step 510, on the first power system artifact using the assigned target variables. The target variables i.e., voltage magnitude and phase angle are important factors for power flow analysis. Voltage magnitude is the measure of electrical potential energy per unit charge, while phase angle is the angular displacement between two alternating current waveforms. Both variables are necessary to accurately calculate power transmission in the power system.

It should be noted that the target variables of the initial conditions are used to perform the power flow analysis on the first power system artifact and to provide the steady state power system. In embodiments, the method provides initial conditions of very high accuracy, which reduces number of iterations of the numerical analysis and thus the total computation time. Furthermore, in embodiments the method utilizes the historical data and predetermined scenarios of power system conditions to tune or improve the computational performance. Additionally, in embodiments the method improves security and stability assessment of the power system by increasing number of scenarios that could be processed by the real-time and planning systems, due to improved performance.

Figure 6:
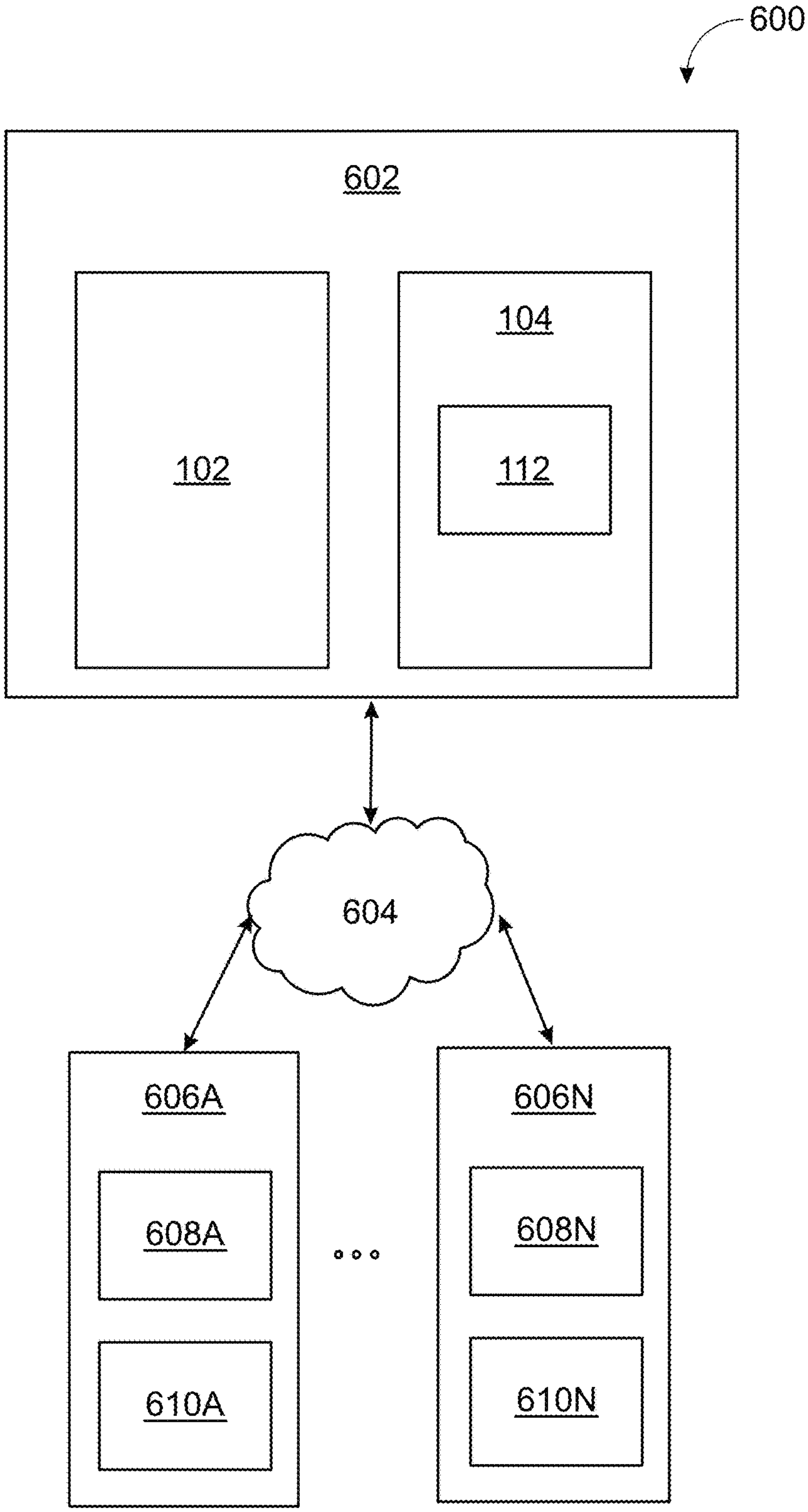
FIG. 6 illustrates a block diagram of the system in a network environment, in accordance with an embodiment of the present disclosure.

Referring now to FIG. 6, a block diagram of the system 600 in a network environment is illustrated, in accordance with an embodiment of the present disclosure. As illustrated, in embodiments, the system 600 includes a server 602 and a plurality of client devices 606A-N. Each of the client devices 606A-N is connected to the server 602 via a communication network 604 such as a Local Area Network (LAN), a Wide Area Network (WAN), Wi-Fi, etc. The server includes the one or more processing units 102 and the memory unit 104 which includes the analysis unit 112 and is accessed by the client devices 606A-N via the network 504.

The analysis unit 112 when executed by the one or more processing units 102 causes the one or more processing units 102 to perform embodiments of the invention as described in greater detail in FIGS. 2 to 5. In an additional embodiment, the server 602 may include a network interface for communicating with the client devices 606A-N via the network 604. Each of the client devices 606A-N is provided with input units 608A-N and display units 610A-N. Users of the client devices 606A-N can access the server 602 via the input units 608A-N. In an exemplary operation, the operator of the client device 606A may send a request through the input unit 608A to the server 602 to perform power flow analysis.

Figure 7:
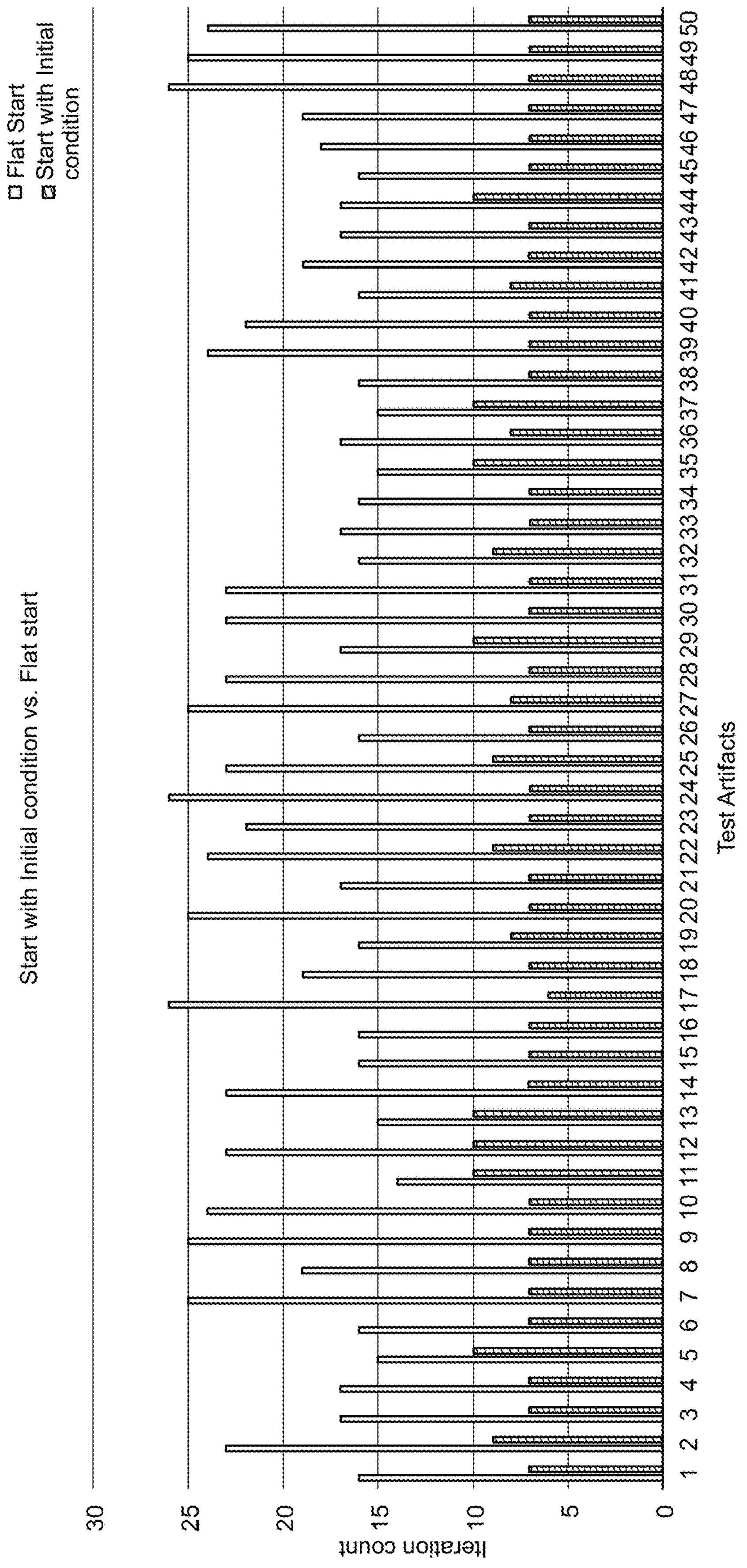
FIG. 7 shows a waveform representation of the comparison of convergence performance, between regular flat-start and start with initial condition, in accordance with an embodiment of the present disclosure.

Referring now to FIG. 7, a waveform representation of the comparison of convergence performance between regular flat-start and start with initial condition is illustrated, in accordance with an embodiment of the present disclosure. In order to compare performance of embodiments of the present invention utilizing the initial condition with the existing method utilizing a regular flat start, SP7 system is modified to utilize the initial conditions for all node voltages and angles obtained from embodiments of the present invention. The dimension of voltage and phase angle that are used in the system are designed to match the dimensions of the static connectivity nodes modeled in the system. For example, to perform embodiments of the invention, about 1000 historical artifacts are considered with about 200 validation artifacts and about 800 training artifacts. These artifacts include plurality of data elements such as PCL, INJ, and TOP, wherein PCL is used for extracting the dataset from the training dataset, while INJ and TOP are used to determine the prediction of initial conditions. Further, as illustrated in FIG. 7, a waveform representation of the result obtained on 50 artifacts of 200 artifacts for regular flat start and start with initial conditions, wherein the X-axis of the waveform represents test artifacts, and the Y-axis represents solution algorithm iteration count. As illustrated, count of iterations performed for converging the power flow analysis for the first power system artifact is smaller when utilized the initial conditions according to embodiments of the present invention than that of the regular flat start.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for enhancing power flow analysis convergence, the method comprising:

receiving a first power system artifact from one or more systems associated with a power system, wherein the first power system artifact includes a plurality of data elements associated with the power system at a given time instant;

extracting a dataset from an archival system, wherein the dataset is extracted based on one or more appropriate data elements selected from the plurality of data elements;

determining, from the dataset, a prediction of initial conditions for the power flow analysis using a machine learning algorithm;

assigning target variables of the predicted initial conditions to the first power system artifact; and performing the power flow analysis on the first power system artifact using the assigned target variables.

2. The method according to claim 1, wherein the one or more systems include at least an industrial control system.

3. The method according to claim 1, wherein the plurality of data elements comprise primary elements including node level injection, local control setpoints and topology, and secondary elements such as primary company load, and any combination thereof.

4. The method according to claim 1, wherein extracting the dataset comprises selecting the one or more appropriate data elements and filtering a training dataset stored in the archival system based on the one or more appropriate data elements, wherein filtering the training dataset comprises performing one of an intuitive filtering, an algorithmic filtering, and a machine learning based filtering.

5. The method according to claim 4, wherein the training dataset comprises a plurality of artifacts, their data elements, and target variables, and wherein the training dataset is created using historical real-time scenarios and predetermined scenarios of power system conditions.

6. The method according to claim 5, wherein the training dataset is archived in the archival system using a static node breaker model.

7. The method according to claim 1, wherein determining the initial conditions for the power flow analysis comprises employing a proximity search algorithm, wherein the proximity search algorithm determines one or more artifacts nearest to the received first power system artifact.

8. The method according to claim 7, wherein the proximity search algorithm uses a distance metric to determine the one or more artifacts from the extracted dataset.

9. The method according to claim 1, wherein the target variables include a voltage magnitude and a phase angle to perform the power flow analysis on the first power system artifact to achieve a steady state of the power system.

10. The method according to claim 1, wherein the first power system artifact, its data elements, and the target variables on which the first power system artifact is analyzed are stored in the archival system.

11. A system for enhancing power flow analysis convergence, the system comprising:

one or more processing units; and a memory unit coupled to the one or more processing units, wherein the memory unit comprises an analysis unit capable of:

receiving a first power system artifact from one or more systems associated with a power system, wherein the first power system artifact includes a plurality of data elements associated with the power system at a given time instant;

extracting a dataset from an archival system, wherein the dataset is extracted based on one or more appropriate data elements selected from the plurality of data elements;

determining, from the dataset, a prediction of initial conditions for the power flow analysis using a machine learning algorithm;

assigning target variables of the predicted initial conditions to the first power system artifact; and performing the power flow analysis on the first power system artifact using the assigned target variables.

12. The system according to claim 11, wherein the analysis unit comprises an advanced analysis unit and a network analysis unit, the advanced analysis unit is configured for receiving the first power system artifact from the one or more systems, extracting the dataset from the archival system, determining from the extracted dataset a prediction of initial conditions for the power flow analysis, and assigning the target variables of the predicted initial conditions to the first power system artifact, and the network analysis unit is configured for performing the power flow analysis on the first power system artifact using the assigned target variables.

13. A computer program product, comprising a computer readable hardware storage device having computer readable program code stored therein, said program code executable by a processor of a computer system to implement a method according to claim 1.

* * * * *